US012341018B2

(12) United States Patent
Theil

(10) Patent No.: US 12,341,018 B2
(45) Date of Patent: Jun. 24, 2025

(54) METHOD FOR PREPARING A SURFACE FOR DIRECT-BONDING

(71) Applicant: ADEIA SEMICONDUCTOR BONDING TECHNOLOGIES INC., San Jose, CA (US)

(72) Inventor: Jeremy Alfred Theil, Mountain View, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/475,977

(22) Filed: Sep. 27, 2023

(65) Prior Publication Data

US 2024/0136196 A1 Apr. 25, 2024
US 2024/0234159 A9 Jul. 11, 2024

Related U.S. Application Data

(63) Continuation of application No. 17/335,833, filed on Jun. 1, 2021, now Pat. No. 11,804,377, which is a
(Continued)

(51) Int. Cl.
*H01L 21/31* (2006.01)
*H01L 21/02* (2006.01)
(Continued)

(52) U.S. Cl.
CPC .... *H01L 21/31053* (2013.01); *H01L 21/0217* (2013.01); *H01L 21/31111* (2013.01);
(Continued)

(58) Field of Classification Search
CPC ........... H01L 21/31053; H01L 21/0217; H01L 21/31111; H01L 24/83; H01L 2224/83031;
(Continued)

(56) References Cited

U.S. PATENT DOCUMENTS

| 4,612,083 A | 9/1986 | Yasumoto et al. |
| 4,818,728 A | 4/1989 | Rai et al. |

(Continued)

FOREIGN PATENT DOCUMENTS

| CN | 105140144 A | 12/2015 |
| CN | 106653720 A | 5/2017 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Mohammad M Hoque
(74) *Attorney, Agent, or Firm* — Knobbe, Martens, Olson & Bear, LLP

(57) ABSTRACT

Improved bonding surfaces for microelectronics are provided. An example method of protecting a dielectric surface for direct bonding during a microelectronics fabrication process includes overfilling cavities and trenches in the dielectric surface with a temporary filler that has an approximately equal chemical and mechanical resistance to a chemical-mechanical planarization (CMP) process as the dielectric bonding surface. The CMP process is applied to the temporary filler to flatten the temporary filler down to the dielectric bonding surface. The temporary filler is then removed with an etchant that is selective to the temporary filler, but nonreactive toward the dielectric surface and toward inner surfaces of the cavities and trenches in the dielectric bonding surface. Edges of the cavities remain sharp, which minimizes oxide artifacts, strengthens the direct bond, and reduces the bonding seam.

16 Claims, 6 Drawing Sheets

Related U.S. Application Data continuation of application No. 16/371,402, filed on Apr. 1, 2019, now Pat. No. 11,056,348.

(60) Provisional application No. 62/653,315, filed on Apr. 5, 2018.

(51) Int. Cl.
*H01L 21/3105* (2006.01)
*H01L 21/311* (2006.01)
*H01L 23/00* (2006.01)

(52) U.S. Cl.
CPC .... *H01L 24/83* (2013.01); *H01L 2224/83031* (2013.01); *H01L 2224/83896* (2013.01)

(58) Field of Classification Search
CPC ........... H01L 2224/83896; H01L 24/08; H01L 24/80; H01L 2224/03005; H01L 2224/03845; H01L 2224/08145; H01L 2224/8001; H01L 2224/80031; H01L 2224/80047; H01L 2224/80345; H01L 2224/80359; H01L 2224/80896; H01L 2224/94
USPC ....................................................... 257/618
See application file for complete search history.

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,034,393 A | 3/2000 | Sakamoto et al. |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,150,281 A * | 11/2000 | Kwean ............... H01L 21/76816 257/E21.507 |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,355,153 B1 | 3/2002 | Uzoh et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,541,382 B1 | 4/2003 | Cheng et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,507,979 B1 | 8/2013 | Huang et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |

(56) References Cited

U.S. PATENT DOCUMENTS

| | | |
|---|---|---|
| 8,841,002 B2 | 9/2014 | Tong |
| 8,916,448 B2 | 12/2014 | Cheng et al. |
| 8,988,299 B2 | 3/2015 | Kam et al. |
| 9,040,385 B2 | 5/2015 | Chen et al. |
| 9,064,937 B2 | 6/2015 | Edelstein et al. |
| 9,082,627 B2 | 7/2015 | Tong et al. |
| 9,082,644 B2 | 7/2015 | Ossimitz et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,368,866 B2 | 6/2016 | Yu |
| 9,385,024 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,090,351 B2 | 10/2018 | Ashidate et al. |
| 10,103,122 B2 | 10/2018 | Liu et al. |
| 10,147,641 B2 | 12/2018 | Enquist et al. |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,269,778 B2 | 4/2019 | Lin et al. |
| 10,276,619 B2 | 4/2019 | Kao et al. |
| 10,276,909 B2 | 4/2019 | Huang et al. |
| 10,312,275 B2 | 6/2019 | Hynecek |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,672,654 B2 | 6/2020 | Uzoh et al. |
| 10,707,087 B2 | 7/2020 | Uzoh et al. |
| 10,790,262 B2 | 9/2020 | Uzoh et al. |
| 10,796,913 B2 | 10/2020 | Lin |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,552,041 B2 | 1/2023 | Fountain, Jr. et al. |
| 11,804,377 B2 | 10/2023 | Theil |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0072423 A1 | 4/2004 | Jorne et al. |
| 2004/0084414 A1 | 5/2004 | Sakai et al. |
| 2004/0126990 A1 | 7/2004 | Ohta |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0161795 A1* | 7/2005 | Tong ................ H01L 24/73 257/E21.705 |
| 2005/0181542 A1 | 8/2005 | Enquist |
| 2006/0024950 A1 | 2/2006 | Choi et al. |
| 2006/0057945 A1 | 3/2006 | Hsu et al. |
| 2006/0138368 A1 | 6/2006 | Lee |
| 2007/0096294 A1 | 5/2007 | Ikeda et al. |
| 2007/0111386 A1 | 5/2007 | Kim et al. |
| 2007/0212870 A1 | 9/2007 | Yang et al. |
| 2007/0222048 A1 | 9/2007 | Huang |
| 2007/0257366 A1 | 11/2007 | Wang et al. |
| 2007/0295456 A1 | 12/2007 | Gudeman et al. |
| 2008/0122092 A1 | 5/2008 | Hong |
| 2009/0108469 A1 | 4/2009 | Kang et al. |
| 2009/0197408 A1 | 8/2009 | Lehr et al. |
| 2009/0200668 A1 | 8/2009 | Yang et al. |
| 2010/0164066 A1 | 7/2010 | Di Franco |
| 2011/0074040 A1 | 3/2011 | Frank et al. |
| 2011/0290552 A1 | 12/2011 | Palmateer et al. |
| 2012/0068355 A1* | 3/2012 | Aoki ................ H01L 24/09 257/737 |
| 2012/0211894 A1 | 8/2012 | Aoyagi |
| 2012/0212384 A1 | 8/2012 | Kam et al. |
| 2012/0319280 A1 | 12/2012 | Suganuma et al. |
| 2013/0020704 A1 | 1/2013 | Sadaka |
| 2013/0034948 A1 | 2/2013 | Huang et al. |
| 2013/0075900 A1 | 3/2013 | Shim et al. |
| 2013/0078783 A1 | 3/2013 | Nieh et al. |
| 2013/0187287 A1 | 7/2013 | Park et al. |
| 2013/0221527 A1 | 8/2013 | Yang et al. |
| 2013/0256913 A1 | 10/2013 | Black et al. |
| 2013/0284885 A1 | 10/2013 | Chen et al. |

(56) References Cited

U.S. PATENT DOCUMENTS

| | | |
|---|---|---|
| 2013/0320556 A1 | 12/2013 | Liu et al. |
| 2013/0328186 A1 | 12/2013 | Uzoh et al. |
| 2014/0105674 A1 | 4/2014 | Hayashi et al. |
| 2014/0131869 A1 | 5/2014 | Pendse |
| 2014/0145338 A1 | 5/2014 | Fujii et al. |
| 2014/0175655 A1 | 6/2014 | Chen et al. |
| 2014/0206109 A1 | 7/2014 | Ossimitz et al. |
| 2014/0217593 A1 | 8/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0096798 A1 | 4/2015 | Uzoh |
| 2015/0097022 A1 | 4/2015 | Di Cioccio et al. |
| 2015/0108644 A1 | 4/2015 | Kuang et al. |
| 2015/0155263 A1 | 6/2015 | Farooq et al. |
| 2015/0200073 A1 | 7/2015 | Jen et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0307819 A1 | 10/2015 | Ida et al. |
| 2015/0340269 A1 | 11/2015 | Rivoire et al. |
| 2015/0340371 A1 | 11/2015 | Lue |
| 2015/0364434 A1 | 12/2015 | Chen et al. |
| 2016/0013099 A1* | 1/2016 | Tanida ............... H01L 24/08 438/107 |
| 2016/0086923 A1 | 3/2016 | Best |
| 2016/0148816 A1 | 5/2016 | Lee et al. |
| 2016/0181228 A1* | 6/2016 | Higuchi ............ H01L 25/0657 257/774 |
| 2016/0190103 A1 | 6/2016 | Kabe et al. |
| 2016/0197055 A1* | 7/2016 | Yu ..................... H01L 24/81 257/737 |
| 2016/0322414 A1 | 11/2016 | Chen et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0179029 A1 | 6/2017 | Enquist et al. |
| 2017/0194271 A1 | 7/2017 | Hsu et al. |
| 2017/0250160 A1 | 8/2017 | Wu et al. |
| 2017/0278698 A1 | 9/2017 | Ikegawa et al. |
| 2017/0358551 A1 | 12/2017 | Liu et al. |
| 2017/0365487 A1 | 12/2017 | Shen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0269325 A1 | 9/2018 | Cheng et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0350674 A1 | 12/2018 | Uzoh |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1 | 6/2019 | Wang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0118156 A1 | 4/2023 | Gao et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |

(56) References Cited

U.S. PATENT DOCUMENTS

| | | |
|---|---|---|
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0222315 A1 | 7/2024 | Uzoh |

FOREIGN PATENT DOCUMENTS

| | | |
|---|---|---|
| CN | 106920795 A | 7/2017 |
| CN | 107039380 A | 8/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 01-168040 | 7/1989 |
| JP | 4-259249 | 9/1992 |
| JP | 05-029183 | 2/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-033786 A | 2/2013 |
| JP | 2013-033900 A | 2/2013 |
| JP | 2013-243333 | 12/2013 |
| JP | 2018-160519 | 10/2018 |
| JP | 2019-129199 | 8/2019 |
| KR | 10-2012-0106366 | 9/2012 |
| KR | 10-2015-0097798 | 8/2015 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

Appeal Decision of Rejection issued on Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Canadian Office Action issued Aug. 1, 2013 in Canadian Patent Application No. 2,618,191, 4 pages.

Canadian Office Action, mailed May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

D'Agostino, R., "Plasma etching of Si and SiO2 in SF6—O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

Derbyshire, Katherine, "The darker side of hybrid bonding," Semiconductor Engineering, Dec. 17, 2020, https://semiengineering.com/author/katherine/, 6 pages.

Dysard, Jeffrey M. et al., "CMP solutions for the integration of high-k metal gate technologies," ECS Transactions, 2010, vol. 33, Issue 10, pp. 77-89.

Fan et al., "Copper water bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing(CMP)," In Chemical Mechanical Polish for ULSI Multilevel Interconnection Conference Feb. 1999; 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Final Written Decision, Inter Partes Review, U.S. Pat. No. 7,485,968, Case IPR2013-00381, dated Feb. 27, 2014, in 3 pages.

Gao, Guilian et al., "Scaling package interconnects below 20 m pitch with hybrid bonding," 2018 IEEE 68th Electronic Components and Technology Conference (ECTC), IEEE, May 29, 2018, pp. 314-322, XP033380016.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding, " Proceedings of the Second International Symposium on Semiconductor Wafer Bonding: Science, Technology and Applications, The Electrochemical Society Proceedings, vol. 93-29 (1993), pp. 395-409.

Handbook of Thin Film Technology, Maissel and Glang, 1983 Reissue, pp. 12-24.

(56) References Cited

OTHER PUBLICATIONS

Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (Cubic) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," MRS Online Proceedings Library (OPL). Jan. 1999; 566:211; 6 pages.
Iida, A. et al., "The study of initial mechanism for Al—Au solid phase diffusion flip-chip bonding," Jpn. J. Appl. Phys. 40, 1997, pp. 3044-3661.
International Search Report and Written Opinion mailed Apr. 22, 2019 in International Application No. PCT/US2018/064982, 13 pages.
International Search Report and Written Opinion mailed Mar. 7, 2019, in International Application No. PCT/US2018/060044, 14 pages.
International Search Report and Written Opinion dated Jan. 10, 2019, for PCT Application No. PCT/US2018/051537, 3 pages.
International Search Report and Written Opinion mailed Oct. 8, 2019, in International Application No. PCT/US2019/037072, 13 pages.
WO2020028080 Search Report and Written Opinion, Jul. 2019, 9 pages.
International Search Report and Written Opinion mailed Dec. 6, 2019, in International Application No. PCT/US2019/047513, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jensen K. et al., "Thermal Chemical Vapor Deposition," in *Thin Film Processes II*, Vossen et al. [Eds], Chapter III-1; Academic Press Inc., 1991, 62 pages.
Juang, Jing-Ye et al., "Copper-to-copper direct bonding on highly (111)-oriented nanotwinned copper in no-vacuum ambient," Scientific Reports, Sep. 17, 2018, vol. 8, 13910 in 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kern W. et al., "Chemical Vapor Deposition of Inorganic Thin Films," in *Thin Film Processes*, Vossen et al. [Eds}. Chapter III-2, Academic Press, 1978, 62 pages.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond strengthening in the 200-400 C range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo, "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, p. 018103-1-018103-7.
Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects On Copper Chemical Mechanical Planarization," University of Central Florida STARS, Electronic Theses and Dissertations, 2004, Paper 36, 111 pages.
Matsuzawa et al., "Room-temperature interconnection of electroplated Au microbump by means of surface activated bonding method," Electronic Components and Technology Conference, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

(56) References Cited

OTHER PUBLICATIONS

Oberhammer, J. et al., "Sealing of adhesive bonded devices on wafer level," Sensors and Actuators A, 2004, vol. 110, No. 1-3, pp. 407-412.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Ortleb, Thomas et al., "Controlling macro and micro surface topography for a 45nm copper CMP process using a high resolution profiler," Proc. Of SPIE, 2008, vol. 6922, 11 pages.
Paul, E. et al., "A model of copper CMP," J. Electrochem. Soc., 2005, vol. 152, Issue 4, pp. G322-G328.
Petition for Inter Partes Review of U.S. Pat. No. 7,485,968, IPR 2013-00381, filed Jun. 21, 2013, pp. 1-49.
Plössl, A. et al., "Wafer direct bonding: tailoring adhesion between brittle materials," Materials Science and Engineering: R: Reports. Mar. 10, 1999;25(1-2):1-88.
Reiche et al., "The effect of a plasma pretreatment on the Si/Si bonding behavior," Electrochemical Society Proceedings, 1998, vol. 97-36, pp. 437-444.
Rhoades R.L., "The dark art of CMP." Future Fab International. 2008;24: 76-85.
Roberds et al., "Low temperature, in situ, plasma activated wafer bonding," Electrochemical Society Proceedings, 1997, vol. 97-36, pp. 598-606.
Rosales-Yeomans, D. et al., "Evaluation of pad groove designs under reduced slurry flow rate conditions during copper CMP," Journal of The Electrochemical Society, 2008, vol. 155, No. 10, pp. H812-H818.
Samsung Galaxy S7 Edge Teardown, posted Apr. 24, 2016, contributing authors: Jim Morrison, Ray Fontaine, Dick James and Daniel Yang, https://www.techinsights.com/blog/samsung-galaxy-s7-edge-teardown, last accessed on May 16, 2022, 6 pages.
Sart C., et al., "Cu/SiO2 hybrid bonding; Finite element modeling and experimental characterization," 2016 6th Electronic System—Integration Technology Conference (ESTC), IEEE, Sep. 13, 2016, pp. 1-7, XP033015798.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card,"Tranducers, Solid-State Sensors, Actuators and Microsystems, 12th International Conference, Jun. 8-12, 2003, vol. 2, pp. 1522-1525.
Steinkirchner, J. et al., Silicon wafer bonding via designed monolayers Advanced materials. Jul. 1995;7(7): 662-665.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mechanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (excerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: Science and technology," John Wiley & Sons, Inc., 1999, Table of Contents, Preface in 120 pages.
Tong, Q.Y. et al., "Semiconductor wafer bonding: Science and technology," John Wiley & Sons, Inc., 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.

(56) References Cited

OTHER PUBLICATIONS

Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold -gold thermocompression bonds," Mater. Soc. Symp. Proc. 605, 1999, pp. 171-176.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.
Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820.".
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

\* cited by examiner

METHOD FOR PREPARING A SURFACE FOR DIRECT-BONDING

RELATED APPLICATIONS

This patent application is a continuation of and claims priority to U.S. patent application Ser. No. 17/335,833, filed Jun. 1, 2021, which is a continuation of and claims priority to U.S. patent application Ser. No. 16/371,402, filed Apr. 1, 2019, now U.S. Pat. No. 11,056,348, which claims benefit of priority to U.S. Provisional Patent Application No. 62/653,315, filed Apr. 5, 2018, all of which are incorporated herein by reference in their entirety.

BACKGROUND

Wafer-level microfabrication in the semiconductor arts often relies on etching to create trenches and cavities in wafer surfaces. A substrate of insulator material, such as silicon oxide, can be patterned with open trenches and cavities where a metal conductor will be deposited. Part of the wafer surface is protected from the etchant by a masking material. The masking material may be a photoresist that has been applied in a pattern, through photolithography.

After the etchant creates the cavities or trenches, copper metal (Cu) may be deposited on the insulator material, overfilling the trenches. Damascene processes may be used to inlay the open trenches with the copper metal. Then, chemical-mechanical planarization (CMP) may be used to remove the copper overburden above the top plane of the trench or cavity. The copper in the trenches remains as patterned conductive lines. The process may be repeated many times to build up many-layered interconnect structures. Cavities and trenches in a silicon oxide substrate may serve many other purposes besides hosting patterned conductors.

Both "trenches" are "cavities" are referred to herein as "cavities" to streamline the description, although trenches and cavities may have different origins and different purposes.

Rounding is the deviation in the dielectric surface extending from the interface with the meta that is no longer parallel to the silicon surface. Dielectric loss and surface planarity are important parameters for CMP in which Cu is to be involved in later stages of the fabrication. A barrier usually has a relatively slow removal rate, acting as a stop layer for dielectric removal on the larger field. Some wafer sections are cleared faster than others, resulting in surface nonplanarity. Appearance of step-like discontinuities may even appear near relatively harder areas due to redistribution of the contact forces. Each cavity edge is an interface between the dielectric layer and air. Polishing forces are orthogonal to these interfaces, resulting in an extreme redistribution of contact forces, thereby leading to a local increase in the dielectric removal rate. This causes oxide corner rounding, and as a result, dielectric erosion. Corner erosion allows the future Cu conductor to more easily protrude into the dip, setting the stage for eventual metal thinning in a next CMP stage and an increase in functional line resistance from the metal thinning.

Referring to FIG. 1, when fabricating bonded wafers with cavities 100 using a direct-oxide bonding process, a common process flow meticulously prepares the bonding surface 102 of the wafer for the contact bonding, then patterns and etches the wafer to form the cavities 100 as the last step before the contact bonding, as shown in FIG. 1. An example of such a direct oxide-bonding process is the ZiBond® brand direct bonding process (Ziptronix Inc. and Invensas Corporation, subsidiaries of Xperi Corporation, San Jose, CA). Silicon oxide 104 is a common material for the bonding surface 102 involved and thus for the interior surfaces 106 of the cavities 100. The silicon oxide 104, or other dielectric material, may be disposed over a layer of silicon 108, for example. The oxide surface topography 110 is often critical for achieving a high-quality bond, so the bonding surface 102 must have low surface roughness and little or no rounding 118 at the edges 112 of cavities 100 to ensure a good molecular bond, and must have a globally flat surface to bring the opposing surfaces close enough to enable bond formation at a molecule-to-molecule level for direct-bonding.

The surface and surface features at the edge 112 of each cavity 100 should therefore come to a sharp corner 112 that has low rounding 118 in order to ensure minimal bond seams adjacent to each cavity 100. Minimizing this bond seam at the edge 112 of each cavity 100 permits minimization of the associated oxide wall width in turn, thereby reducing overall cavity bonding seam dimensions. An obstacle in the process depicted in FIG. 1 arises because the oxide surface 102 may be covered with photoresist 114, an organic material applied onto the inorganic silicon oxide 104, which then has to be completely removed without affecting the critical oxide bonding surface 102. The strip and clean process can be difficult, because plasma ashing can lead to surface roughening, which degrades the quality of the bond to be formed. Chemical-mechanical planarization (CMP) 116 provides an alternative method of cleaning after stripping the resist, but leads to increased rounding 118 on the edges 112 of the cavities 100 because the lack of material in the cavities 100 allows a slight deformation of mechanical polisher 116 at the very edge 112 resulting in marginally higher oxide polishing rates near the cavity edges 112. This slight perturbation of the polisher 116 at the edges 112 results in undesirable rounding 118 of the cavity edges.

SUMMARY

Improved bonding surfaces for microelectronics are provided. An example method of protecting an oxide surface for direct bonding during a microelectronics fabrication process includes overfilling cavities and trenches in the oxide surface with a temporary filler that has an approximately equal chemical and mechanical resistance to a chemical-mechanical planarization (CMP) process as the oxide bonding surface. The CMP process is applied to the temporary filler to flatten the temporary filler down to the oxide bonding surface. The temporary filler is then removed with an etchant that is selective to the temporary filler, but nonreactive toward the oxide surface and toward inner surfaces of the cavities and trenches in the oxide bonding surface. Edges of the cavities remain sharp, which minimizes oxide artifacts, strengthens the direct bond, and reduces the bonding seam.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes systems and processes for improving bonding surfaces for microelectronics. The example processes described herein lead to stronger direct bonds with higher bond integrity, in microelectronics packages. The example techniques are especially useful for fabricating bonded wafers that have cavities and trenches in the surfaces to be joined at the bonding interface, especially during direct-oxide bonding (oxide-to-oxide direct-bonding) of the surfaces to be joined.

Figure 2:
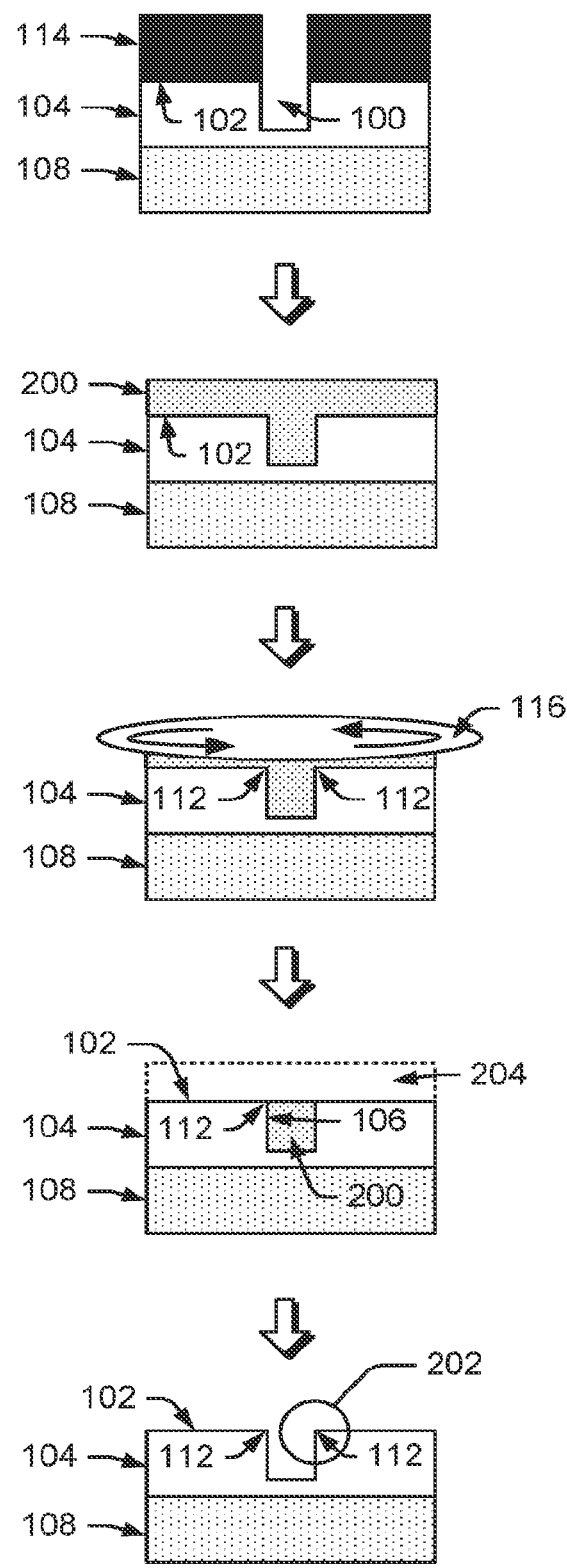
FIG. 2 is a diagram of an example method of protecting a bonding surface that has cavities, during preparation for direct-bonding.

FIG. 2 shows an example process for improving a bonding surface 102 that has cavities. The example process starts with patterning using a photoresist 114 and subsequent etching to create a cavity 100 in an oxide layer 104 of a die or wafer. The bonding surface 102 of the oxide layer 104 is then cleared of the photoresist 114. Removing the photoresist 114 and residues uses stripping and cleaning processes to some degree. The stripping and cleaning processes can impart an undesirable surface roughening that is detrimental to the goal of direct-bonding the bonding surface 102 to an opposing surface.

Before CMP polishing is applied, a sacrificial material or temporary filler 200 is deposited in the cavity 100 and overfilled onto the bonding surface 102. The temporary filler 200 is selected to have CMP removal properties that are very similar to the CMP removal properties of the oxide layer 104 itself. The oxide layer 104 and the temporary filler 200 are intended to be as close as possible to being indistinguishable to the CMP process 116, so that the CMP process 116 has a similar or the same 1:1 selectivity to the temporary filler 200 as to the oxide layer 104 with respect to both the chemical component of the CMP polishing and the mechanical component of the CMP polishing. After placement of the sacrificial material or temporary filler 200, the die or wafer then undergoes the CMP process, which planarizes the temporary filler 200 down to the bonding surface 102. The temporary filler 200 ensures that the edges (corners) 112 of the cavity 100 remain sharp 202, and that any rounding tendency (118 in FIG. 1) near the cavity edge 112 or corners is minimized or eliminated altogether.

Next, a second etchant 204 is applied, such as a wet-chemical etchant 204, that is selective or highly selective to the temporary filler 200, but not to the oxide layer 104. The second etchant 204 removes the temporary filler 200, while remaining nonreactive to the oxide layer 104, including the inner surfaces 106 of the cavity 100.

In an implementation, the oxide layer 104 is a silicon oxide, and the sacrificial material or temporary filler 200 is silicon nitride. Phosphoric acid may be used as the second etchant 204 that is selective to the silicon nitride 200 but nonreactive with respect to the silicon oxide 104.

Figure 1:
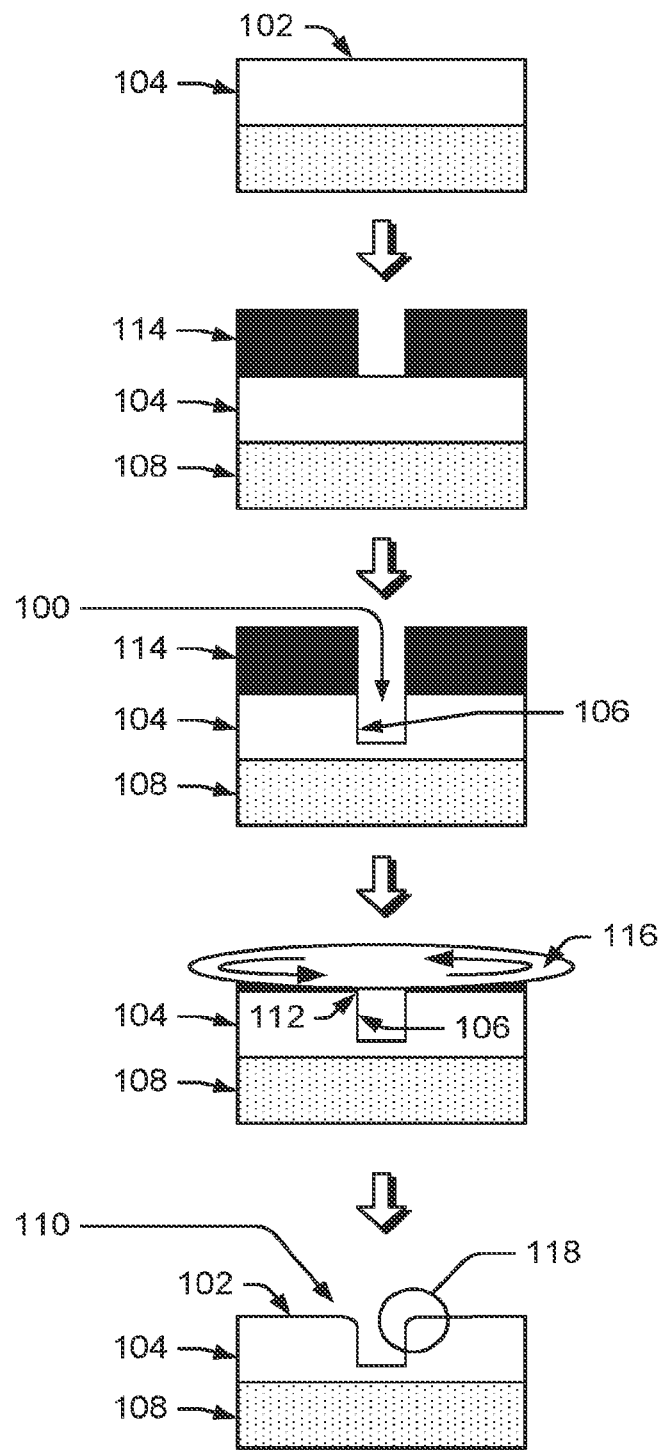
FIG. 1 is a diagram of an example conventional process for making cavities in a bonding surface for microelectronics.

An advantage of the example process shown in FIG. 2 is that the CMP process 116 may be applied after formation of the cavity 100 so that the bonding surface 102 can be prepared with improved flatness and with roughness eliminated without risking an increase in conventional rounding (118 in FIG. 1) of the cavity edges 112 due to exposure of open cavity edges 112 during the polish 116, as shown back in FIG. 1.

The cavity 100 as shown in FIG. 2 only extends into the oxide layer 104, but the cavity 100 can extend into layers below the oxide layer 104 too. Since lower layers beneath the oxide layer 104 are not involved with the CMP process 116, the selectivity of the CMP process 116 to these lower layers, such as silicon, is not important to the example process described here. However, the etchant 204 for removing the temporary filler 200 should be nonreactive with respect to these lower layers, just as the selective etchant 204 is nonreactive with the oxide layer 104.

Figure 3:
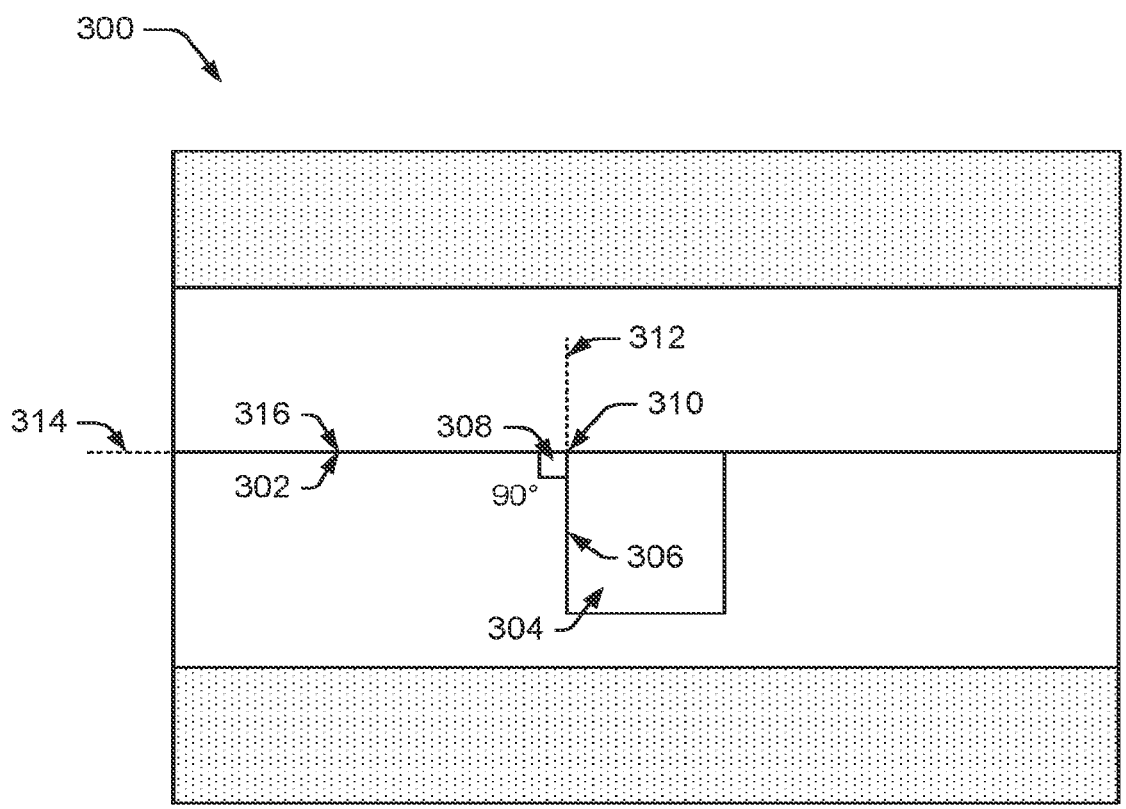
FIG. 3 is a diagram of an example bonded wafer with cavities that have sharp corners with a few angstroms for direct bonding with a second surface.

FIG. 3 shows a cross-sectional close-up of an example bonded wafer 300. A first horizontal bonding surface 302 of the bonded wafer is made of a dielectric material, such as silicon dioxide. The first horizontal bonding surface 302 has been flattened by a chemical-mechanical planarization (CMP) process. A cavity 304 has been created in the first horizontal bonding surface 302, by etching for example. A vertical wall 306 of the cavity 304 is disposed at a 90° angle to the first horizontal bonding surface 302. The dielectric material of the vertical wall 306 of the cavity 304 and the dielectric material of the first horizontal bonding surface 302 make a 90° corner 308 at a line or a point 310. The 90° corner 308 made of the dielectric material defines an intersection of a vertical plane 312 of the vertical wall 306 of the cavity 304 and a horizontal plane 314 of the first horizontal bonding surface 302.

The first horizontal bonding surface 302 of the bonded wafer 300 can be flattened by the chemical-mechanical planarization (CMP) process to a depth of field of a standard photolithography system. The flatness of the first horizontal bonding surface 302 may be smooth (flat or planar) by the CMP process to within less than 5 angstroms (Å). Ideally, an obtainable flatness has a slope equivalent to 5 nm in vertical rise variation over each 100 μm span of horizontal run. A desirable roughness specification is preferably less than 0.5 nm RMS. These are preferred values to be achieved, but the example systems and processes described herein still work outside of these preferred goals. The 90° corner 308 made of dielectric material where the vertical wall 306 of the cavity 304 meets the first horizontal bonding surface 302 may form a more perfect geometric 90° corner 308 with little or no rounding in the dielectric material, to within a few angstroms. Most conventional etches try to achieve as good a 90° corner as possible, but conventional industrial processes may deviate the corner by +/−3° from a 90° corner.

A second horizontal bonding surface 316 is direct-bonded to the first horizontal bonding surface 302. The first horizontal bonding surface 302 and the second horizontal bonding surface 316 may be direct-bonded together with an oxide-to-oxide direct bond. The oxide-to-oxide direct-bond between the first horizontal bonding surface 302 and the second horizontal bonding surface 316 is present at a geometric point 310 where the vertical wall 306 of the cavity 304 and the horizontal bonding surface 302 meet at the 90° corner 308.

The bonded wafer 300 may be two wafers direct-bonded together by a wafer-to-wafer process or may be a die and a wafer direct-bonded together by a die-to-wafer process.

Example Process Flows

Figure 4:
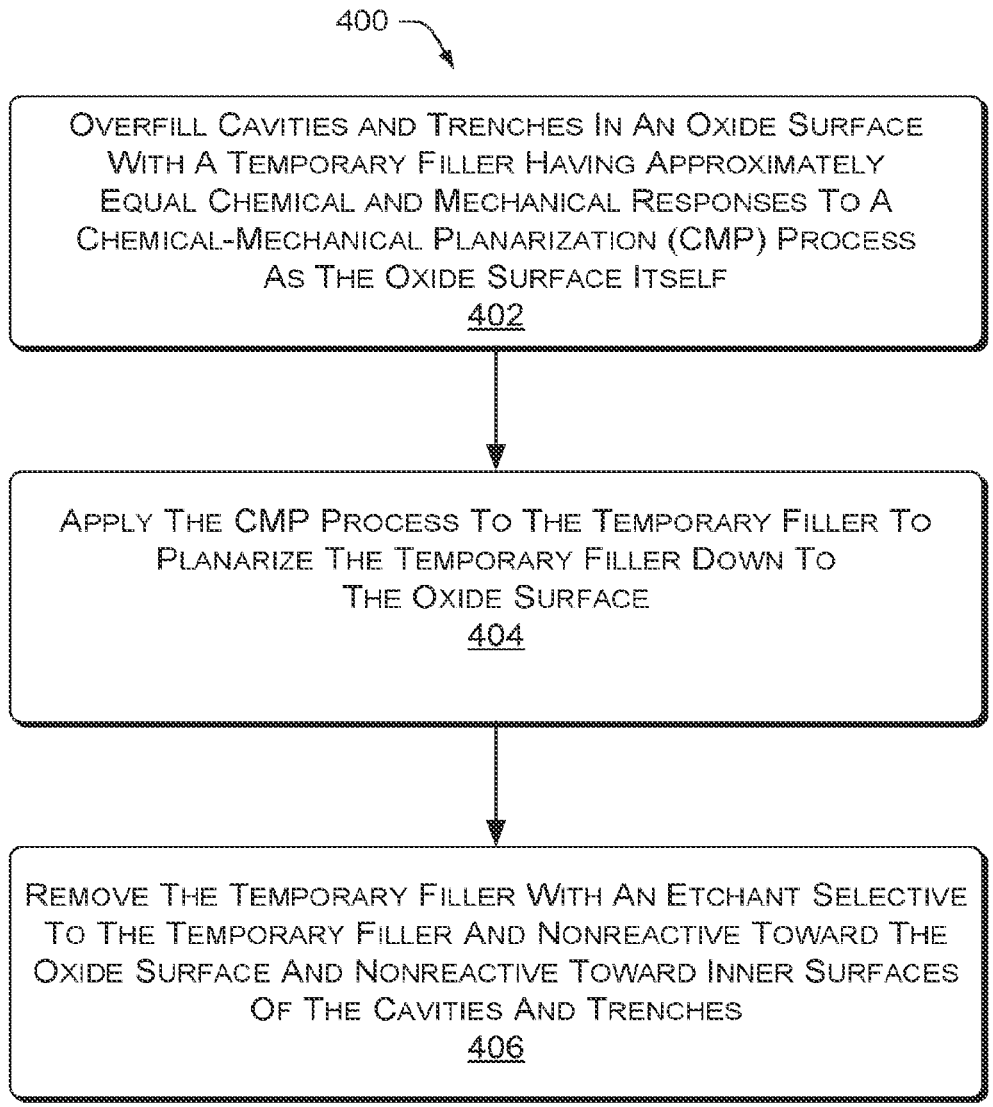
FIG. 4 is a flow diagram of an example method for protecting an oxide surface for bonding during a microelectronics fabrication process.

FIG. 4 shows an example of method 400 of protecting an oxide surface for bonding during a microelectronics fabrication process. Operations of the example method 400 are shown in individual blocks.

At block 402, cavities and trenches in the oxide surface are overfilled with a temporary filler having approximately equal chemical and mechanical responses to a chemical-mechanical planarization (CMP) process as the oxide surface itself.

At block 404, the CMP process is applied to the temporary filler to planarize the temporary filler down to the oxide surface.

At block 406, the temporary filler is removed with an etchant that is selective to the temporary filler and nonreactive toward the oxide surface and nonreactive toward inner surfaces of the cavities and trenches.

The oxide surface may be a silicon oxide surface and the temporary filler may be silicon nitride, for example. In this case, the etchant can be a phosphoric acid etchant to selectively remove the silicon nitride while being nonreactive towards the silicon oxide surfaces.

Figure 5:
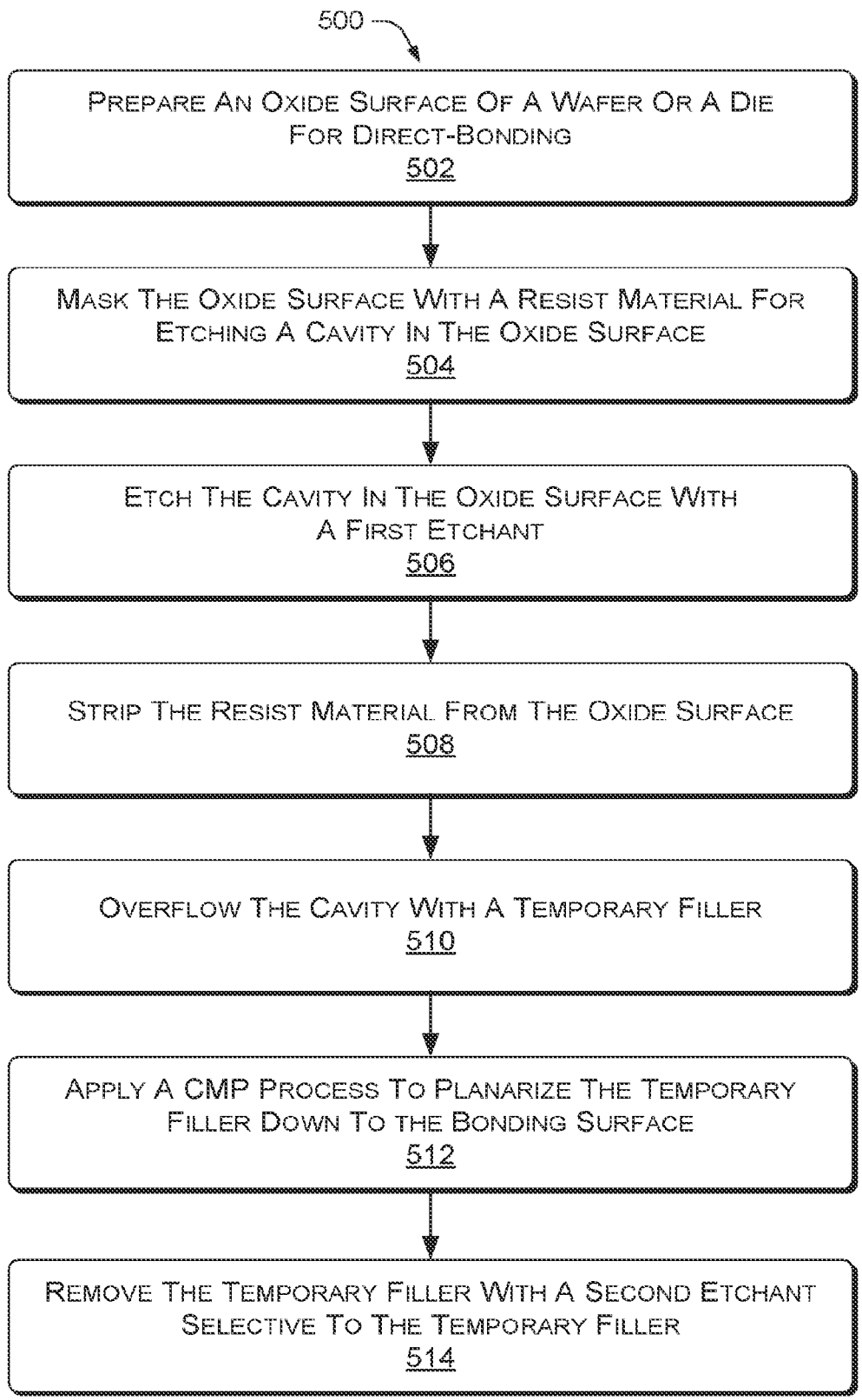
FIG. 5 is a flow diagram of an example method of an example method for improving bonding surfaces for microelectronics.

FIG. 5 shows an example method 500 of improving bonding surfaces for microelectronics. Operations of the example method 500 are shown in individual blocks.

At block 502, an oxide surface of a wafer or die is prepared for direct-bonding during a microelectronics fabrication process. The preparation includes planarization and cleaning of the surface, and sometimes activation of the surface molecules through plasma activation. In preparing the oxide surface before masking, the planarizing may bring the oxide surface to a flatness comparable to a depth of field of a photolithography system.

At block 504, the oxide surface is masked with a resist material for etching a cavity in the oxide surface.

At block 506, the cavity is etched in the oxide surface with a first etchant.

At block 508, the resist material is stripped from the oxide surface.

At block 510, the cavity is overflowed with a temporary filler to preserve edges of the cavity during a chemical-mechanical planarization (CMP) process, wherein the temporary filler possesses chemical and physical properties similar to the oxide surface with respect to the chemical-mechanical planarization (CMP) process, and wherein the CMP process has approximately equal selectivity for the oxide surface and the temporary filler.

At block 512, a CMP process is applied to planarize the temporary filler down to an interface between the temporary filler and the silicon oxide.

At block 514, the temporary filler is removed with a second etchant selective to the temporary filler and nonreactive to the oxide surface and nonreactive to the inner surfaces of the cavity.

The oxide surface may be a silicon oxide and the temporary filler may be silicon nitride. In this implementation, the second etchant can be phosphoric acid to selectively etch the silicon nitride while remaining nonreactive to the silicon oxide surface. The cavity may have a depth penetrating through a layer of the silicon oxide surface into an underlying layer below the layer of silicon oxide, such as a layer of silicon.

Figure 6:
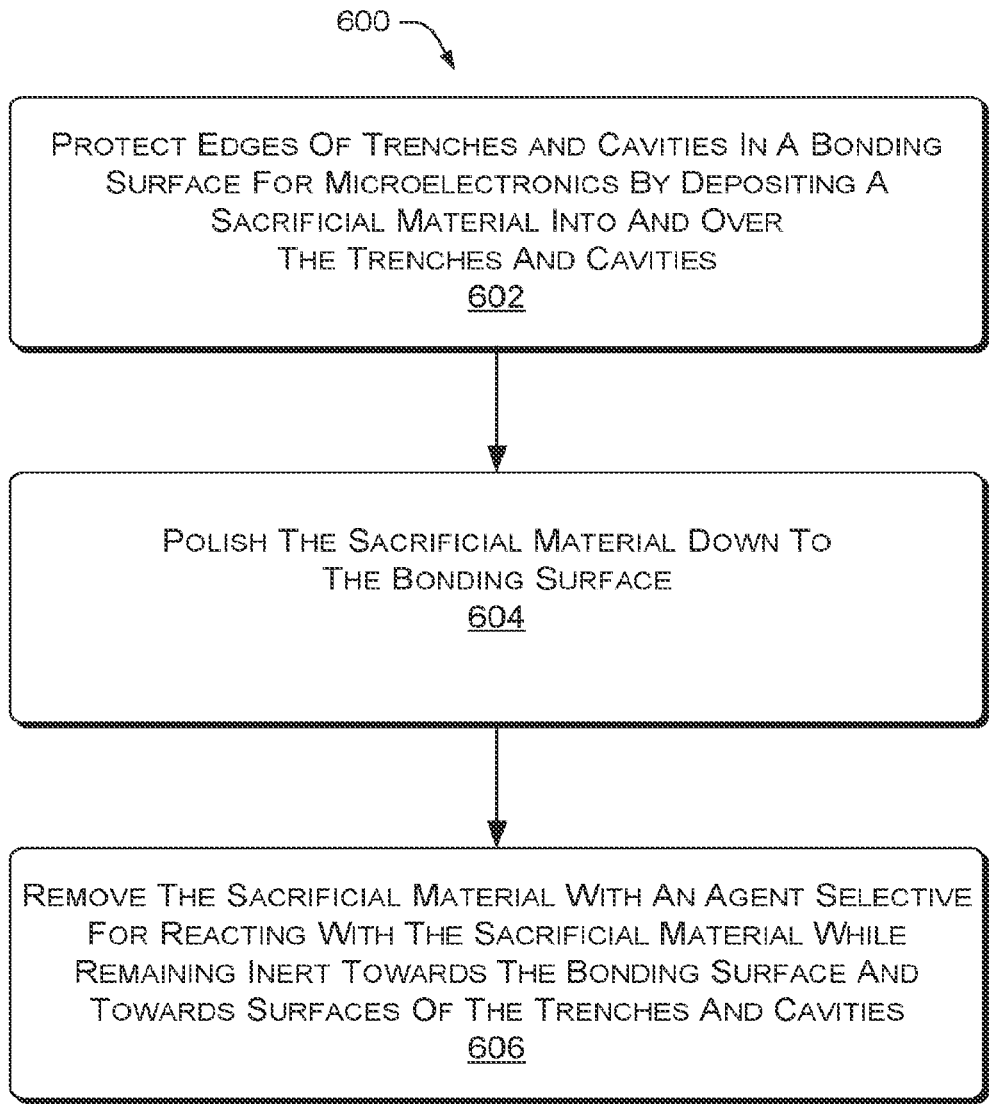
FIG. 6 is a flow diagram of an example method for protecting edges of trenches and cavities of a bonding surface for direct-bonding.

FIG. 6 shows an example method 600 of protecting edges of trenches and cavities of a bonding surface. Operations of the example method 600 are shown in individual blocks.

At block 602, edges of trenches and cavities in a bonding surface for microelectronics are protected by depositing a sacrificial material into and over the trenches and cavities.

At block 604, the sacrificial material is polished down to the bonding surface.

At block 606, the sacrificial material is removed with an agent selective for reacting with the sacrificial material while remaining inert towards the bonding surface and towards surfaces of the trenches and cavities.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A bonded structure, comprising:
a first die or wafer comprising a dielectric material having a first horizontal bonding surface, the first horizontal bonding surface flattened for direct-bonding, a cavity formed in the first horizontal bonding surface, the cavity having a vertical wall, the vertical wall comprising the dielectric material, wherein the vertical wall and the first horizontal bonding surface intersect at a first corner of a 90° angle having a deviation less than +/−3°;
a second die or wafer comprising a second horizontal bonding surface; and
wherein the first horizontal bonding surface is direct-bonded to the second horizontal bonding surface.

2. The bonded structure of claim 1, wherein a flatness of the first horizontal bonding surface is within 5 angstroms.

3. The bonded structure of claim 1, wherein the first horizontal bonding surface comprises a slope less than 5 nm in vertical rise variation over each 100 μm of horizontal span.

4. The bonded structure of claim 1, wherein the first corner is direct-bonded to the second horizontal bonding surface.

5. The bonded structure of claim 1, wherein the dielectric material comprises silicon oxide.

6. The bonded structure of claim 1, wherein the first horizontal bonding surface is direct-bonded to the second horizontal bonding surface forming a second corner between the vertical wall and the second horizontal surface.

7. The bonded structure of claim 1, wherein the bonded structure comprises two wafers direct-bonded together by a wafer-to-wafer process.

8. The bonded structure of claim 1, wherein the bonded structure comprises a die and a wafer direct-bonded together by a die-to-wafer process.

9. The bonded structure of claim 1, further comprising a metal conductor deposited in the cavity.

10. The bonded structure of claim 1, wherein the first horizontal bonding surface is direct-bonded to the second horizontal bonding surface comprises an oxide-to-oxide direct bond.

11. A microelectronic die or wafer, comprising:
a bonding surface formed on a dielectric layer, the dielectric layer disposed over a silicon layer, the bonding surface flattened for direct-bonding;
a cavity formed in the dielectric layer, the cavity forming an edge corner between the bonding surface and a vertical wall of the cavity; and
wherein the edge corner comprises a corner of a 90° angle having a deviation less than +/−3°.

12. The microelectronic die or wafer of claim 11, wherein the flatness of the bonding surface is within 5 angstroms.

13. The microelectronic die or wafer of claim 11, the dielectric layer comprises silicon oxide.

14. The microelectronic die or wafer of claim 11, wherein the cavity has a depth penetrating through the dielectric layer into silicon layer.

15. A bonded structure comprising the microelectronic die or wafer or claim 11 and a microelectronic device, wherein the microelectronic die or wafer is direct-bonded to the microelectronic device.

16. The microelectronic die or wafer of claim 11, further comprising a metal conductor deposited in the cavity.

* * * * *